(12) United States Patent
Clark et al.

(10) Patent No.: US 10,855,237 B1
(45) Date of Patent: Dec. 1, 2020

(54) METHOD FOR CHANGING AUDIO LIMITER SETTINGS UNDER LOW ALTERNATING-CURRENT (AC) LINE VOLTAGE CONDITION

(71) Applicant: BOSE CORPORATION, Framingham, MA (US)

(72) Inventors: Andrew W. Clark, Shrewsbury, MA (US); Frank Walter Thomas, Ashby, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 16/429,307

(22) Filed: Jun. 3, 2019

(51) Int. Cl.
| | |
|---|---|
| *H03F 3/21* | (2006.01) |
| *H03F 3/183* | (2006.01) |
| *G05F 1/575* | (2006.01) |
| *H03F 1/52* | (2006.01) |
| *H03F 3/217* | (2006.01) |
| *H02M 3/335* | (2006.01) |
| *G01R 19/04* | (2006.01) |
| *G05F 3/26* | (2006.01) |
| *H02M 1/00* | (2006.01) |

(52) U.S. Cl.
CPC ......... *H03F 3/2173* (2013.01); *G01R 19/04* (2013.01); *G05F 1/575* (2013.01); *G05F 3/265* (2013.01); *H02M 3/33576* (2013.01); *H02M 2001/0003* (2013.01)

(58) Field of Classification Search
USPC ................. 330/127, 129, 279, 297, 134
See application file for complete search history.

(56) References Cited

U.S. PATENT DOCUMENTS

| | | | |
|---|---|---|---|
| 7,994,857 B2* | 8/2011 | Albers .................. | H03F 3/2173 330/251 |
| 9,054,658 B2* | 6/2015 | Nussbaum ............... | H03F 1/52 |

\* cited by examiner

*Primary Examiner* — Hieu P Nguyen
(74) *Attorney, Agent, or Firm* — Patterson + Sheridan, LLP (57) ABSTRACT

Certain aspects of the present disclosure are generally directed to circuitry and techniques for adjusting an audio signal to avoid undesirable system behavior under low alternating-current (AC) line voltage and high volume conditions. For example, certain aspects provide an apparatus for audio amplification. The apparatus generally includes an amplifier, a supply voltage generation circuit having an input coupled to an input voltage node of the apparatus and an output coupled to a supply voltage terminal of the amplifier, the supply voltage generation circuit having a transformer, a primary winding of the transformer being coupled to the input voltage node, a peak voltage detector circuit configured to detect a peak voltage at a secondary winding of the transformer, and a controller circuit configured to adjust an input audio signal of the amplifier based on the detected peak voltage.

18 Claims, 5 Drawing Sheets

METHOD FOR CHANGING AUDIO LIMITER SETTINGS UNDER LOW ALTERNATING-CURRENT (AC) LINE VOLTAGE CONDITION

FIELD

The present disclosure relates to audio signal processing, and more specifically, to circuitry for audio amplification.

BACKGROUND

A speaker is a transducer that produces a pressure wave in response to an input electrical signal, and thus, sound is generated. The speaker input signal may be produced by an audio amplifier that receives a relatively lower voltage analog audio signal and generates an amplified signal to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By changing the electrical signal from the audio amplifier, the mechanical force generated by the interaction between the magnet and the voice coil is modulated and causes the cone to move back and forth, thereby creating the pressure waves interpreted as sound.

SUMMARY

Certain aspects of the present disclosure are generally directed to circuitry and techniques for adjusting an audio signal to avoid undesirable system behavior under low alternating-current (AC) line voltage and high volume conditions.

Certain aspects of the present disclosure are directed to an apparatus for audio amplification. The apparatus generally includes an amplifier, a supply voltage generation circuit having an input coupled to an input voltage node of the apparatus and an output coupled to a supply voltage terminal of the amplifier, the supply voltage generation circuit having a transformer, a first winding of the transformer being coupled to the input voltage node, a peak voltage detector circuit configured to detect a peak voltage at a second winding of the transformer, and a controller circuit configured to adjust an input audio signal of the amplifier based on the peak voltage.

In certain aspects, the peak voltage detector circuit is configured to detect the peak voltage during a recharge phase of the apparatus. In certain aspects, the peak voltage comprises a negative peak voltage. In certain aspects, the apparatus also includes a voltage adjustment circuit configured to generate a level shifted voltage based on the peak voltage, the controller circuit being configured to adjust the input audio signal based on the level shifted voltage. In certain aspects, the peak voltage detector circuit comprises a diode, and a capacitive element coupled to the diode. In certain aspects, an anode of the diode is coupled to the capacitive element and a cathode of the diode is coupled to the second winding, the peak voltage detector circuit being configured as a negative peak detector circuit.

In certain aspects, the voltage adjustment circuit comprises a voltage divider circuit coupled to the peak voltage detector circuit, and the level shifted voltage comprises a voltage divided signal at a tap node of the voltage divider circuit. In certain aspects, the voltage adjustment circuit comprises a signal path between the peak voltage detector circuit and a voltage rail of the supply voltage generation circuit, the signal path comprising a first resistive element of the voltage divider circuit and a second resistive element of the voltage divider circuit. In certain aspects, the signal path further comprises a switch configured to enable or disable the voltage adjustment circuit, the switch being coupled between the tap node and the peak voltage detector circuit. In certain aspects, the signal path further comprises voltage offset circuitry. In certain aspects, the voltage offset circuitry comprises a Zener diode.

In certain aspects, the voltage adjustment circuit further comprises a current mirror branch coupled to the tap node of the voltage divider circuit, the controller circuit being configured to adjust the input audio signal of the amplifier based on an output voltage at an output of the current mirror branch. In certain aspects, the current mirror branch comprises a bipolar transistor having a base coupled to the tap node, and a third resistive element coupled between the voltage rail and an emitter of the bipolar transistor. In certain aspects, the output of the current mirror branch comprises a collector of the bipolar transistor. In certain aspects, the signal path further comprises a diode coupled between the voltage rail and the tap node of the voltage divider circuit. In certain aspects, the controller circuit being configured to adjust the input audio signal of the amplifier based on the peak voltage comprises restricting a maximum volume corresponding to the input audio signal.

Certain aspects of the present disclosure are directed to an apparatus for audio amplification. The apparatus generally includes an amplifier, a supply voltage generation circuit having an input coupled to an input voltage node of the apparatus and an output coupled to a supply voltage terminal of the amplifier, the supply voltage generation circuit having a transformer, a first winding of the transformer being coupled to the input voltage node, a peak detector circuit coupled to a second winding of the transformer, a voltage adjustment circuit coupled to the peak detector circuit, and a controller circuit coupled between an audio input node of the apparatus and an input of the amplifier, an input of the controller circuit being coupled to an output of the voltage adjustment circuit.

Certain aspects of the present disclosure are directed to a method for audio amplification. The method generally includes generating a supply voltage for an amplifier via a transformer having a first winding coupled to an input voltage node, detecting a peak voltage at a second winding of the transformer, and adjusting an input signal of the amplifier based on the peak voltage.

In certain aspects, the peak voltage is detected during a recharge phase of a switch mode power supply coupled to the transformer. In certain aspects, the method also includes generating a voltage adjusted signal based on the peak voltage, the input signal being adjusted based on the voltage adjusted signal. In certain aspects, the peak voltage comprises a negative peak voltage.

DETAILED DESCRIPTION

Certain aspects of the present disclosure are generally directed to circuitry and techniques for adjusting an audio signal to avoid undesirable system behavior under low alternating-current (AC) line voltage and high volume conditions. For example, an AC line voltage may be used to generate, via a power supply, a supply voltage (Vsupply) of an amplifier for audio amplification. The supply voltage dropping below a threshold may result in a power supply collapse under heavy load conditions (e.g., high audio volume) and/or degradation of audio quality. Certain aspects of the present disclosure are directed to detecting a voltage of the power supply, and adjusting the audio signal to avoid (or at least reduce) audio quality degradation and/or to avoid power supply collapse, as described in more detail herein.

As can be understood based on the present disclosure, the techniques and systems described herein are cost-effective and relatively easy to implement. For instance, the techniques include reducing cost of off-line power supply, such that the power supply is well-matched to the nominal equipment operating conditions. If the equipment is operated at reduced AC line voltage, the power supply is unable to produce the requested output current. Further, particularly in modern switch mode power supply (SMPS) power supply (PS) circuits, the AC line voltage is not easily accessible by the secondary side circuits, so it can be inconvenient to monitor the voltage level. Thus, the techniques disclosed herein can, for example, infer the line voltage based at least on the switch-mode transformer turns ratio, thereby producing an easily usable scaled output voltage referenced to the secondary ground. This scaled output can then be used by a digital signal processor (DSP)-based audio limiter circuit to adjust the maximum power supply load and to avoid power supply output voltage collapse (and possible speaker reset). In some implementations, the power supply need not be loaded for the techniques described herein to work, as the techniques can incorporate effects of the power supply loading in a scaled output result. A turn-off mechanism or scheme can also be provided, in some implementations, so that low-power standby operation is not affected. Numerous variations and benefits will be apparent in light of this disclosure.

Figure 1:
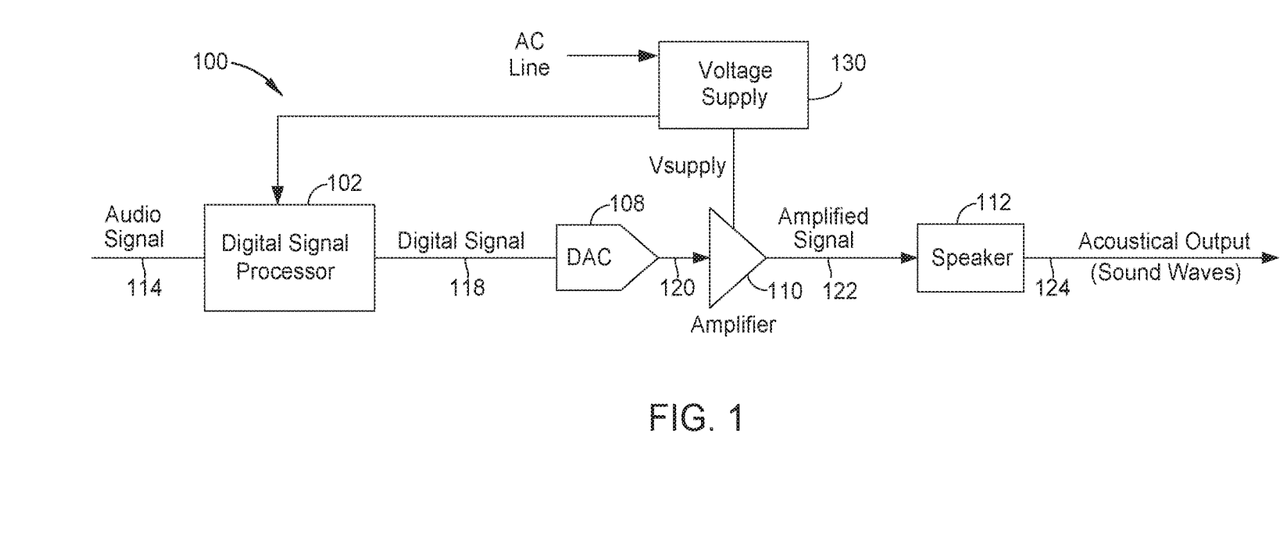
FIG. 1 illustrates an example audio amplifier system, in accordance with certain aspects of the present disclosure.

FIG. 1 illustrates an example audio amplifier system 100, in accordance with certain aspects of the present disclosure. As illustrated, a digital signal processor (DSP) 102 may receive and process audio signals 114 (e.g., a digital audio signal) by applying a digital filter aimed at increasing audio quality. The filtered digital signal 118 produced by the DSP (or a further processed version thereof) may be converted to an analog signal 120 using a digital-to-analog converter (DAC) 108. In certain aspects, the DAC may be implemented as part of the DSP 102 or the amplifier 110. In certain aspects, the analog signal 120 may be amplified using the amplifier 110 to generate the amplified signal 122. The amplified signal 122 may drive a speaker 112 to produce an acoustic output (e.g., sound waves) 124. A supply voltage of the amplifier 110 may be generated by a voltage supply circuit 130 from an AC voltage received via the AC line, as illustrated. In certain aspects, DSP 102 may receive an indication of a voltage (e.g., a bulk capacitor voltage (Vbulk)) at the voltage supply circuit 130 used to generate Vsupply, based on which the DSP 102 may adjust the digital signal 118 to avoid undesirable system behavior under low AC line voltage and high volume conditions. For example, the DSP 102 may implement an audio limiter function which may restrict the maximum volume or excursion of the audio signal (e.g., represented by digital signal 118) when Vbulk drops below a threshold.

Figure 2:
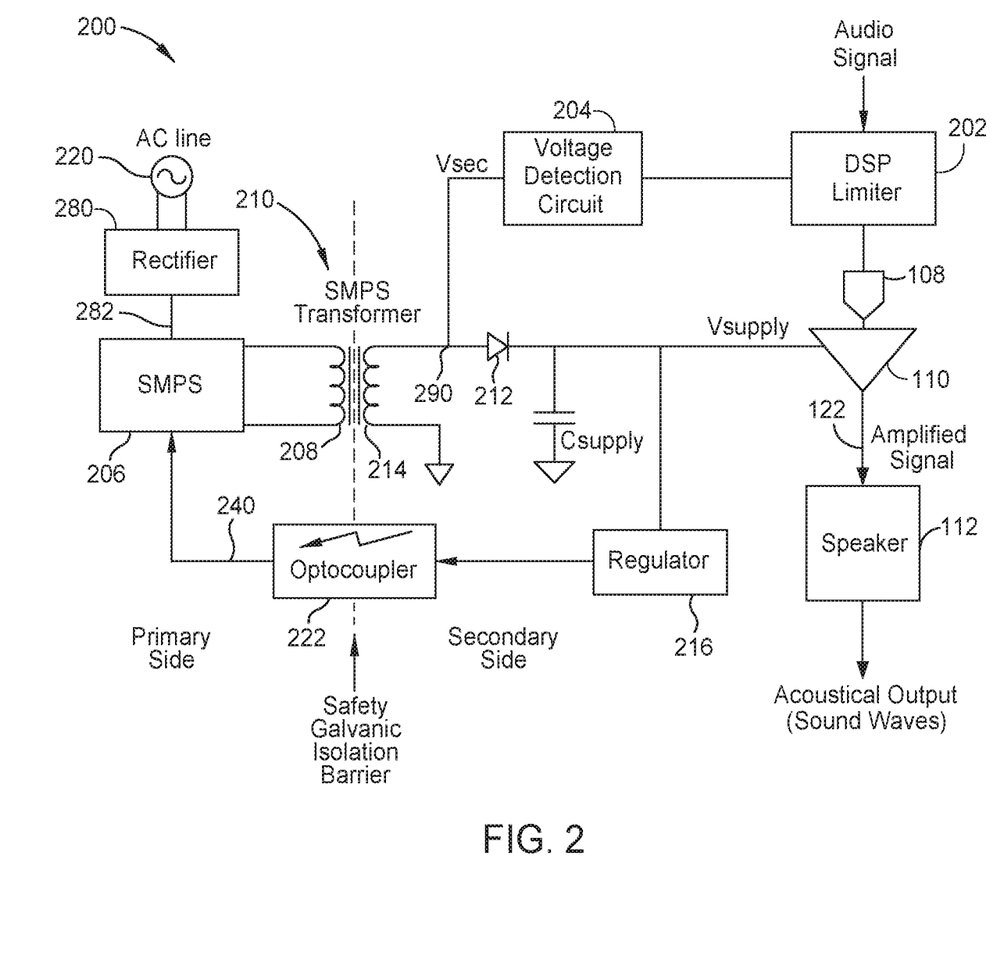
FIG. 2 illustrates an example audio amplifier system implemented with an audio limiter and voltage detection circuit, in accordance with certain aspects of the present disclosure.

FIG. 2 illustrates an example audio amplifier system 200 implemented with an audio limiter 202 and voltage detection circuit 204, in accordance with certain aspects of the present disclosure. The audio limiter 202 (also referred to herein as a "limiter circuit") may be implemented via the DSP 102 described with respect to FIG. 1.

The audio amplifier system 200 may include a switch mode power supply (SMPS) 206 configured to generate a voltage at the first (primary) winding 208 of a transformer 210 based on an AC line voltage received from the AC line voltage source 220. In certain aspects, a rectifier 280 (e.g., full-wave rectifier) may be coupled between the AC line voltage source 220 and the SMPS 206. The rectifier 280 generates Vbulk 282 which is provided to the input of the SMPS 206.

The SMPS 206 may store energy in the primary winding 208 of the transformer 210 during a recharge phase, and transfer the energy to the second (secondary) winding 214 during an energy transfer phase. The SMPS 206 may generate a voltage (Vsec) at the secondary winding 214 (e.g., at node 290) by controlling the duration of the recharge phase and the energy transfer phase based on a feedback signal from the secondary side (e.g., regulator 216) obtained via the feedback path 240. The voltage at the secondary winding 214 may be positive during the energy transfer phase and negative during the recharge phase.

A rectifier (e.g., diode 212) may be coupled to the secondary winding 214 of the transformer 210 for voltage rectification to generate Vsupply for the amplifier 110. Vsupply may be filtered by a capacitor (Csupply) in order to provide a constant direct-current (DC) voltage level for Vsupply. A feedback signal 240 representing Vsupply may be provided by the regulator 216 through an isolation circuit (e.g., optocoupler 222) so that the SMPS 206 may regulate the duration of the recharge phase, as described herein.

In certain aspects, the SMPS 206 may adjust a duty cycle of the signal at the primary winding 208 based on the feedback signal from the regulator 216 through the feedback path 240. The feedback path 240 may include an isolation circuit (e.g., optocoupler 222) to isolate the feedback path between the secondary and primary sides. In other words, the optocoupler 222 implements a safety galvanic isolation barrier between the primary and secondary sides of the transformer 210, as illustrated. The SMPS 206, transformer 210, diode 212, the optocoupler 222 and the regulator 216 may be part of the voltage supply circuit 130 described with respect to FIG. 1.

In certain aspects, the audio amplifier system 200 may also include a voltage detection circuit 204 which may be configured to estimate the voltage excursion at the primary winding 208 (e.g., Vbulk across a bulk capacitor of the SMPS 206) based on the voltage at the secondary winding 214 (Vsec). The voltage detection circuit 204 may detect Vsec excursion and provide an indication to the audio limiter 202 in order for the audio limiter to adjust limiter settings and avoid power supply collapse under heavy load conditions. In certain aspects, the voltage detection circuit 204 may estimate the voltage (e.g., Vbulk) applied at the primary winding 208 based on Vsec at the secondary winding 214 since the ratio between the voltage at the primary winding and the voltage at the secondary winding is known by design. Note that the AC line voltage is not easily accessible by the secondary side circuitry due to regulatory requirements for isolation.

The SMPS 206, transformer 210, diode 212, and regulator 216 may be part of a primary voltage supply or an auxiliary voltage supply. That is, the voltage supply described with respect to FIG. 2 may be an auxiliary voltage supply implemented in conjunction with another voltage supply, such as an inductor-inductor-capacitor (LLC) converter or forward converter. In other words, the techniques described herein may be applied for an auxiliary voltage supply (as well as a primary voltage supply), so long as the bulk capacitor voltage of interest (e.g., the voltage at the primary winding 208) is the primary voltage of the auxiliary supply.

Figure 3A:
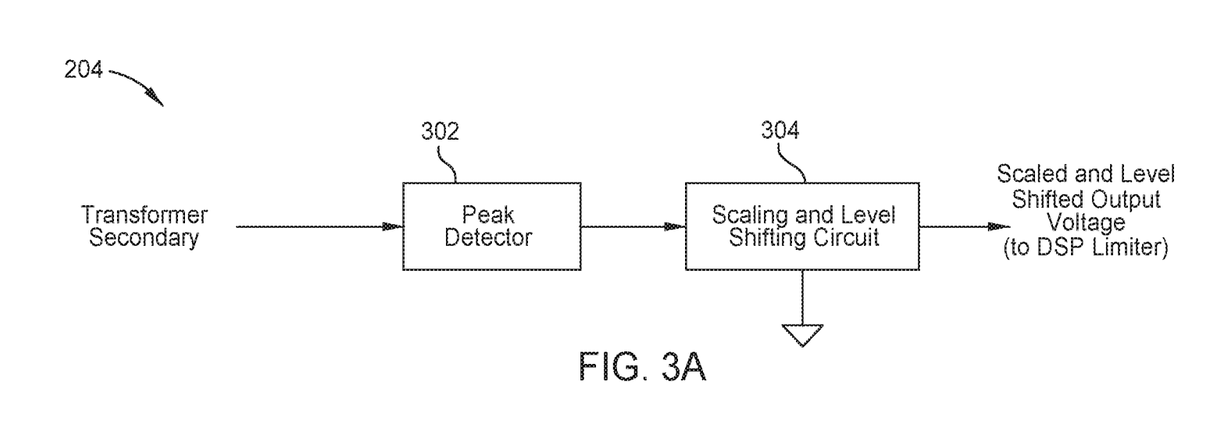
FIG. 3A illustrates an example implementation of a voltage detection circuit, in accordance with certain aspects of the present disclosure.

FIG. 3A illustrates an example implementation of the voltage detection circuit 204, in accordance with certain aspects of the present disclosure. As illustrated, the voltage detection circuit 204 may include a peak detection circuit 302 to detect a peak voltage of Vsec, and a scaling and level shifting circuit 304 to generate a scaled output voltage based on the peak voltage of Vsec. The scaled output voltage may be generated by applying a voltage adjustment factor that is set based on the turns ratio of the transformer 210, effectively estimating the primary side voltage (e.g., Vbulk) by measuring the secondary side voltage. Moreover, the voltage detection circuit 204 generates a scaled output voltage that is referenced to a secondary side reference potential (e.g., secondary electric ground). The scaled output voltage is provided to the audio limiter 202 to adjust the maximum power supply load, avoiding a power supply collapse, as described herein.

The voltage at the secondary winding Vsec may be representative of the primary side voltage (e.g., Vbulk) during the recharge phase of the SMPS 206, as described with respect to FIG. 2. Vsec may be negative during the recharge phase of the SMPS, as described in more detail with respect to FIG. 3B.

Figure 3B:
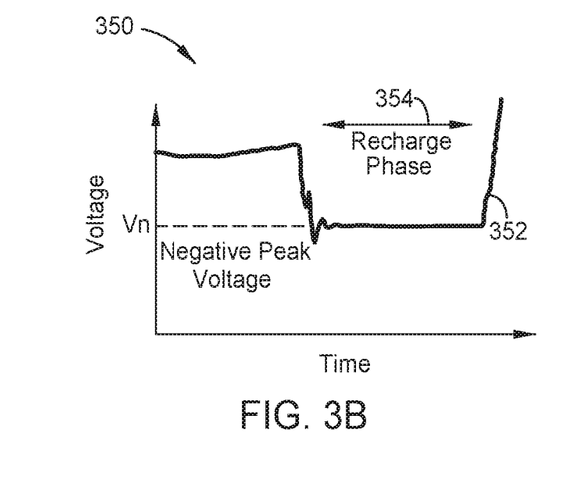
FIG. 3B is a graph illustrating a voltage at a secondary winding of a transformer of an audio amplifier system, in accordance with certain aspects of the present disclosure.

FIG. 3B is a graph 350 illustrating the Vsec 352, in accordance with certain aspects of the present disclosure. As illustrated, during the recharge phase 354, Vsec may drop to a negative voltage Vn, which may be detected by the peak detection circuit 302. In other words, the peak detection circuit 302 may be configured to detect the peak voltage of Vsec during only the recharge phase of the SMPS. For example, the peak detection circuit 302 may be implemented as a negative peak voltage detector for detecting the negative peak voltage of Vsec representing the voltage of Vsec during the recharge phase during which Vsec is negative. The scaling and level shifting circuit 304 may then generate the scaled and level shifted output voltage based on the negative peak voltage.

While the audio amplification system 200 describes an example implementation with voltage rectification implemented at the high side (e.g., at node 290) of the secondary winding 214 to facilitate understanding, the techniques described herein may be applied to any suitable implementation of an audio amplification system. For example, the voltage rectification may be implemented at a low side of the secondary winding 214 in some implementations, in which case, the voltage at the secondary winding being detected to adjust the limiter settings may transition to a positive voltage during the recharge phase of the audio amplifier system. As a result, the peak detector circuit 302 described herein would be configured to detect a positive peak voltage, instead of a negative peak voltage.

Figure 4:
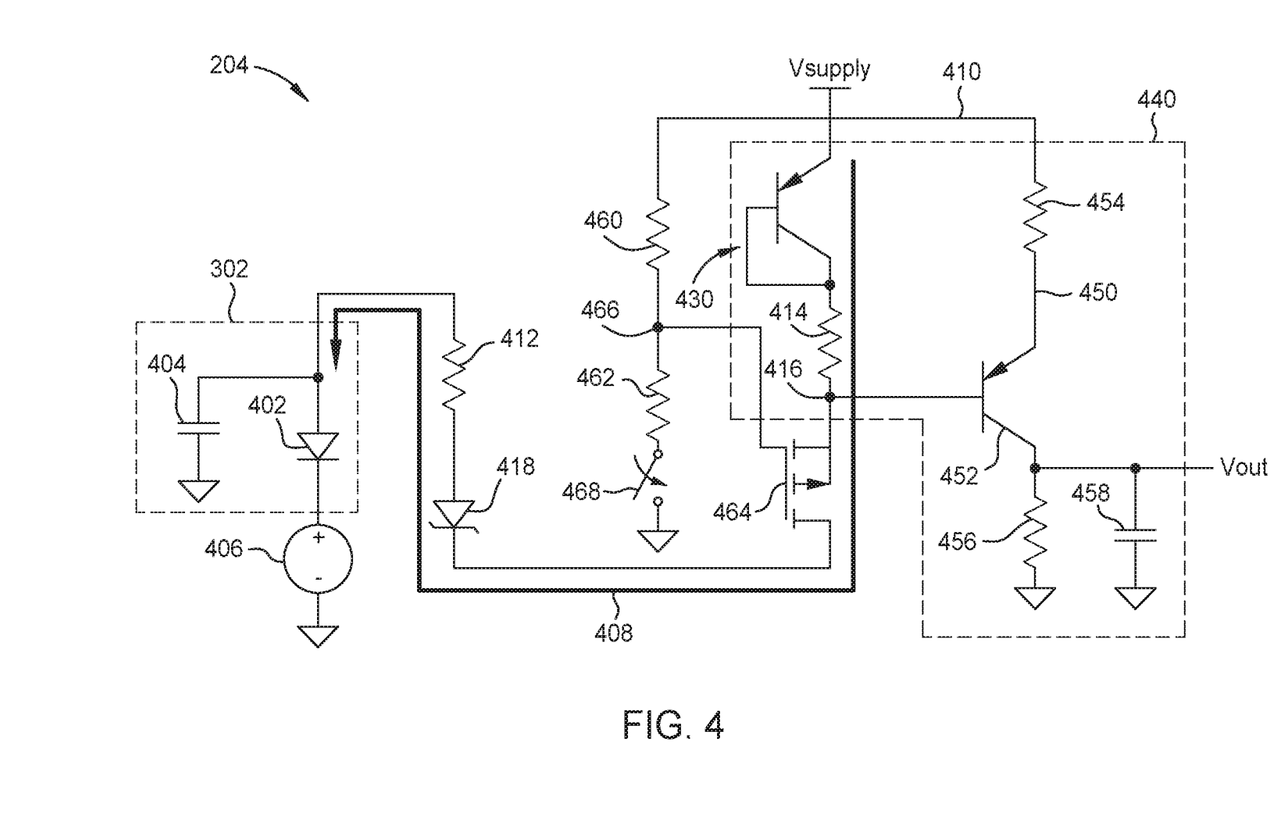
FIG. 4 is an example circuit diagram of a voltage detection circuit, in accordance with certain aspects of the present disclosure.

FIG. 4 is an example circuit diagram of the voltage detection circuit 204, in accordance with certain aspects of the present disclosure. The secondary winding voltage Vsec is represented by a voltage generated via the voltage source 406. As illustrated, the voltage detection circuit 204 includes a peak detection circuit 302 including a voltage rectifier implemented using a diode 402. The anode of the diode 402 is coupled to a capacitive element 404 and the cathode of the diode 402 is coupled to the secondary winding 214 represented by the voltage source 406. Thus, the negative peak voltage of Vsec is stored (e.g., held) across the capacitive element 404.

The voltage detection circuit 204 also includes a signal path 408 coupled between the voltage rail 410 and the peak detection circuit 302. The voltage rail 410 may provide the supply voltage Vsupply described with respect to FIG. 2. The signal path 408 facilitates the scaling and level shifting function of the peak voltage, as described herein. For example, the signal path may include a voltage divider circuit, implemented using resistive elements 412, 414. The voltage divider ratio of the voltage divider circuit may be set to generate a voltage adjusted signal at the tap node 416. The voltage divider ratio may be set based on the excursion of the voltage at the secondary winding 214 and Vsupply in an effort to generate an output voltage (Vout) that is representative of Vbulk 282 and within an operating input voltage range of the audio limiter 202. For example, the resistance of the resistive element 412 may be ten times the resistance of the resistive element 414, such that the voltage drop across the resistive element 412 is ten times the voltage drop of the resistive element 414.

In certain aspects, the signal path 408 may include voltage offset circuitry. For example, the signal path 408 may include a Zener diode 418 or a base-emitter voltage (Vbe) multiplier. The breakdown voltage (e.g., voltage offset) of the Zener diode 418 may selected to set the current flow across resistive element 412 to be proportional to the negative peak voltage stored across the capacitive element 404. For example, the break down voltage of the Zener diode 418 may be set to be about equal to Vsupply minus the expected voltage drop across the diode 430 (e.g., diode-connected transistor) and the resistive element 414. Thus, the Zener diode 418 effectively cancels out the influence of Vsupply and the voltage drop across the diode 430 and the resistive element 414 that would otherwise be on the voltage at the tap node 416. In certain implementations, the signal path 408 may be implemented without the voltage offset circuitry (e.g., Zener diode 418). In this case, the voltage offset may be accounted for via the DSP (e.g., audio limiter 202).

In certain aspects, the diode 430 and the resistive element 414 may implement a first branch of a current mirror stage 440. Resistive elements 454, 456 and a bipolar transistor 452 may implement a second branch of the current mirror stage 440. For example, the second current mirror branch may be coupled to the tap node 416. The second branch of the current mirror stage 440 may be implemented using the bipolar transistor 452 having an emitter coupled to the resistive element 454 and a collector coupled to the resistive element 456. In certain aspects, the resistive element 456 may be in parallel with a capacitive element 458, as illustrated. In certain aspects, the resistance of the resistive elements 414, 454 may be the same such that the voltage drop across and the current through the resistive elements 414, 454 are the same. In certain aspects, the bipolar transistor implementing the diode 430 and the bipolar transistor 452 may be matched components in the same package.

The voltage at node 450 is higher than the voltage at the tap node 416 by an amount equal to the voltage drop across the emitter to base diode of the bipolar transistor 452 if the bipolar transistor implementing the diode 430 and the bipolar transistor 452 are matched. Therefore, the diode 430 is included between the voltage rail 410 and the tap node 416 to compensate for the emitter to base voltage drop of the bipolar transistor 452. Thus, the current across the resistive elements 414, 454 may be about the same, resulting in the voltage at the output node 450 to be proportional, and a scaled version of, the negative peak voltage stored across the capacitive element 404. The scaling of the voltage at the node 450 may be set in accordance with the voltage at the secondary winding 214 and the input voltage range of the audio limiter 202 by adjusting the ratio between the resistances of the resistive elements 412, 414. The resistive elements 454, 456 may be used to set the maximum of the output voltage (Vout) in accordance with the input voltage capability of the audio limiter 202. The output voltage Vout at the collector of the transistor 452 is provided to the audio limiter 202, based on which the limiter settings of the audio limiter 202 may be set, as described herein.

In certain aspects, the signal path 408 may include a switch 464 (e.g., implemented as a p-channel metal-oxide semiconductor field-effect transistor (MOSFET)) to allow for enabling and disabling of the voltage detection circuit 204. For example, the control terminal (e.g., gate) of the switch 464 may be coupled to a tap node (e.g., node 466) of a voltage divider circuit having resistive elements 460, 462 and the switch 468. The switch 468 may be closed when the control terminal of the switch 464 is driven by a voltage divided signal at the tap node (e.g., node 466), turning on the switch 464 and configuring the voltage detection circuit 204 in an enabled mode of operation. In certain aspects, the signal path between the node 466 and the reference potential through the resistive element 462 may be opened by opening switch 468, effectively driving the voltage at node 466 to be about the same as Vsupply, resulting in the switch 464 to be opened. By opening the switch 464, the signal path 408 is opened, effectively configuring the voltage detection circuit 204 in a disabled mode of operation.

Figure 5:
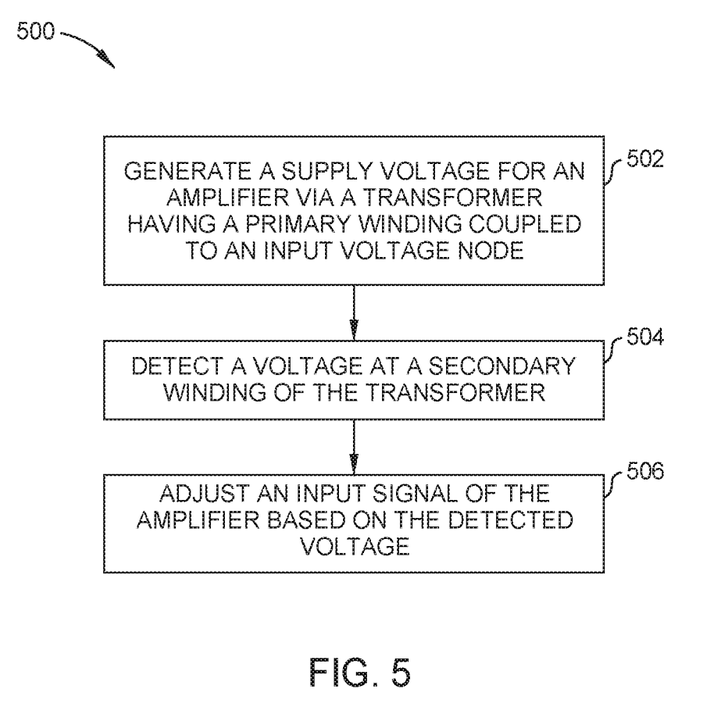
FIG. 5 is a flow diagram illustrating example operations for audio amplification, in accordance with certain aspects of the present disclosure.

FIG. 5 is a flow diagram illustrating example operations 500 for audio amplification, in accordance with certain aspects of the present disclosure. The operations 500 may be performed via an audio amplifier system, such as the audio amplifier system 200 including the voltage detection circuit 204 as described herein with respect FIGS. 2-4.

The operations 500 begin, at block 502, by generating a supply voltage (e.g., Vsupply) for an amplifier via a transformer (e.g., transformer 210) having a primary winding (e.g., primary winding 208) coupled to an input voltage node. At block 504, a voltage (e.g., a peak voltage) is detected (e.g., via the voltage detection circuit 204) at a secondary winding (e.g., secondary winding 214) of the transformer, and at block 506, an input signal (e.g., audio signal) of the amplifier is adjusted (e.g., via the audio limiter 202) based on the detected voltage. In certain aspects, the peak voltage is detected during a recharge phase of an SMPS (e.g., SMPS 206) coupled to the transformer.

In certain aspects, the operations 500 may also include generating a voltage adjusted signal (e.g., via signal path 408 and current mirror stage 440) based on the peak voltage, the input signal being adjusted based on the voltage adjusted signal. In certain aspects, the voltage adjust signal is generated by applying a voltage adjustment factor to the peak voltage, as described herein.

While the examples provided herein have described an audio amplification system to facilitate understanding, the aspects described herein can be applicable to any suitable amplification system. For example, the voltage detection circuit 204 can be used to estimate the voltage at the primary winding 208, based on which an input signal to any suitable amplifier may be adjusted to avoid adverse effects associated with the amplification of the input signal. For instance, the input signal to the amplifier can be adjusted to avoid distortion or non-linearity associated with the amplifier.

Aspects of the present disclosure may take the form of an entirely hardware implementation, an entirely software implementation (including firmware, resident software, micro-code, etc.), or an implementation combining software and hardware aspects that may all generally be referred to herein as a "circuit," "module," or "system." The present disclosure may be a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network (LAN), a wide area network (WAN) and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++, or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a LAN or a WAN, or the connection may be made to an external computer (for example, through the Internet using an Internet Service Provider (ISP)). In some examples, electronic circuitry including, for example, programmable logic circuitry, field-programmable gate arrays (FPGAs), or programmable logic arrays (PLAs) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to examples of the present disclosure, other and further examples of the disclosure may be devised without departing from the basic scope thereof, and the scope thereof is determined by the claims that follow.

What is claimed is:

1. An apparatus for audio amplification, comprising:
   an amplifier;
   a supply voltage generation circuit having an input coupled to an input voltage node of the apparatus and an output coupled to a supply voltage terminal of the amplifier, the supply voltage generation circuit having a transformer, a first winding of the transformer being coupled to the input voltage node;
   a peak voltage detector circuit configured to detect a peak voltage at a second winding of the transformer, wherein the peak voltage detector circuit is configured to detect the peak voltage during a recharge phase of the apparatus; and
   a controller circuit configured to adjust an input audio signal of the amplifier based on the peak voltage.

2. The apparatus of claim 1, wherein the peak voltage comprises a negative peak voltage.

3. The apparatus of claim 1, further comprising a voltage adjustment circuit configured to generate a level shifted voltage based on the peak voltage, the controller circuit being configured to adjust the input audio signal based on the level shifted voltage.

4. The apparatus of claim 3, wherein the peak voltage detector circuit comprises:
   a diode; and
   a capacitive element coupled to the diode.

5. The apparatus of claim 4, wherein an anode of the diode is coupled to the capacitive element and a cathode of the diode is coupled to the second winding, the peak voltage detector circuit being configured as a negative peak detector circuit.

6. The apparatus of claim 3, wherein:
   the voltage adjustment circuit comprises a voltage divider circuit coupled to the peak voltage detector circuit; and
   the level shifted voltage comprises a voltage divided signal at a tap node of the voltage divider circuit.

7. The apparatus of claim 6, wherein the voltage adjustment circuit comprises a signal path between the peak voltage detector circuit and a voltage rail of the supply voltage generation circuit, the signal path comprising a first resistive element of the voltage divider circuit and a second resistive element of the voltage divider circuit.

8. The apparatus of claim 7, wherein the signal path further comprises a switch configured to enable or disable the voltage adjustment circuit, the switch being coupled between the tap node and the peak voltage detector circuit.

9. The apparatus of claim 7, wherein the signal path further comprises voltage offset circuitry.

10. The apparatus of claim 9, wherein the voltage offset circuitry comprises a Zener diode.

11. The apparatus of claim 7, wherein the voltage adjustment circuit further comprises a current mirror branch coupled to the tap node of the voltage divider circuit, the controller circuit being configured to adjust the input audio signal of the amplifier based on an output voltage at an output of the current mirror branch.

12. The apparatus of claim 11, wherein the current mirror branch comprises:
   a bipolar transistor having a base coupled to the tap node; and
   a third resistive element coupled between the voltage rail and an emitter of the bipolar transistor.

13. The apparatus of claim 12, wherein the output of the current mirror branch comprises a collector of the bipolar transistor.

14. The apparatus of claim 12, wherein the signal path further comprises a diode coupled between the voltage rail and the tap node of the voltage divider circuit.

15. The apparatus of claim 1, wherein the controller circuit being configured to adjust the input audio signal of the amplifier based on the peak voltage comprises restricting a maximum volume corresponding to the input audio signal.

16. A method for audio amplification, comprising:
   generating a supply voltage for an amplifier via a transformer having a first winding coupled to an input voltage node;
   detecting, during a recharge phase of a switch mode power supply coupled to the transformer, a peak voltage at a second winding of the transformer; and
   adjusting an input signal of the amplifier based on the peak voltage.

17. The method of claim 16, further comprising generating a voltage adjusted signal based on the peak voltage, the input signal being adjusted based on the voltage adjusted signal.

18. The method of claim 16, wherein the peak voltage comprises a negative peak voltage.

* * * * *